(12) United States Patent
Shiraishi et al.

(10) Patent No.: US 7,240,429 B2
(45) Date of Patent: Jul. 10, 2007

(54) MANUFACTURING METHOD FOR A PRINTED CIRCUIT BOARD

(75) Inventors: Yoshihiko Shiraishi, Nagoya (JP); Koji Kondo, Toyohashi (JP)

(73) Assignee: DENSO Corporation, Kariya (JP)

( * ) Notice: Subject to any disclaimer, the term of this patent is extended or adjusted under 35 U.S.C. 154(b) by 406 days.

(21) Appl. No.: 10/909,434

(22) Filed: Aug. 3, 2004

(65) Prior Publication Data

US 2005/0000725 A1 Jan. 6, 2005

Related U.S. Application Data

(62) Division of application No. 10/163,998, filed on Jun. 7, 2002, now Pat. No. 6,818,836.

(30) Foreign Application Priority Data

Jun. 13, 2001 (JP) ............... 2001-179117

(51) Int. Cl.
H01K 3/10 (2006.01)

(52) U.S. Cl. .............. 29/852; 29/830; 29/846; 29/850; 29/878; 174/260; 174/261; 174/262; 257/E23.062; 257/E23.077; 361/738; 361/760

(58) Field of Classification Search .............. 29/852, 29/830, 846, 850, 878; 174/260–262; 257/E23.062, 257/E23.077; 361/738, 760
See application file for complete search history.

(56) References Cited

U.S. PATENT DOCUMENTS

| | | | |
|---|---|---|---|
| 4,401,767 A | 8/1983 | Dietz et al. | |
| 4,436,785 A | 3/1984 | Dietz et al. | |
| 4,459,166 A | 7/1984 | Dietz et al. | |
| 4,490,429 A | 12/1984 | Tosaki et al. | |
| 4,521,329 A | 6/1985 | Siuta et al. | |

(Continued)

FOREIGN PATENT DOCUMENTS

EP 0 851 725 A1 7/1998

(Continued)

OTHER PUBLICATIONS

First Office Action issued from Japanese Patent Office dispatched on Oct. 25, 2005 for the corresponding Japanese patent application No. 2001-179117 (a copy and English translation thereof).

(Continued)

Primary Examiner—A. Dexter Tugbang
Assistant Examiner—Tim Phan
(74) Attorney, Agent, or Firm—Posz Law Group, PLC (57) ABSTRACT

A conductor pattern is formed on a resin film which is made of a thermoplastic resin. Each single-sided conductor pattern film has via-holes filled with an electrically conductive paste. A printed conductor pattern and a printed resistor are formed on a ceramic substrate. The single-sided conductor pattern films are laminated on the ceramic substrate. Then, the multilayered assembly is heated and pressed from both sides thereof to obtain a printed circuit board. During the heat and press treatment, respective single-sided conductor pattern films and the ceramic substrate bond together while the interlayer connection is obtained between the conductor patterns as well as between the conductor pattern and the printed conductor pattern.

8 Claims, 2 Drawing Sheets

U.S. PATENT DOCUMENTS

| | | | |
|---|---|---|---|
| 4,629,681 A | 12/1986 | Takada et al. | |
| 4,736,521 A | 4/1988 | Dohya | |
| 4,763,403 A | 8/1988 | Klein et al. | |
| 4,795,670 A | 1/1989 | Nishigaki et al. | |
| 5,111,003 A | 5/1992 | Kimbara | |
| 5,375,042 A | 12/1994 | Arima et al. | |
| 5,478,972 A | 12/1995 | Mizutani et al. | |
| 5,622,769 A * | 4/1997 | Kozuka et al. | 428/209 |
| 5,652,042 A | 7/1997 | Kawakita et al. | |
| 5,733,467 A | 3/1998 | Kawakita et al. | |
| 5,740,603 A | 4/1998 | Kim | |
| 5,847,326 A | 12/1998 | Kawakami et al. | |
| 5,914,358 A | 6/1999 | Kawakita et al. | |
| 5,943,212 A | 8/1999 | Horiuchi et al. | |
| 5,977,490 A | 11/1999 | Kawakita et al. | |
| 6,114,753 A | 9/2000 | Nagai et al. | |
| 6,118,183 A | 9/2000 | Umehara et al. | |
| 6,197,407 B1 * | 3/2001 | Andou et al. | 428/209 |
| 6,228,467 B1 | 5/2001 | Taniguchi et al. | |
| 6,351,026 B2 | 2/2002 | Hirasawa et al. | |
| 6,353,189 B1 | 3/2002 | Shimada et al. | |
| 6,407,343 B1 | 6/2002 | Tanaka | |
| 6,458,912 B1 | 10/2002 | Kuroki et al. | |
| 6,535,398 B1 | 3/2003 | Moresco | |

FOREIGN PATENT DOCUMENTS

| | | |
|---|---|---|
| EP | 1 069 617 | 1/2001 |
| JP | A-S58-073904 | 5/1983 |
| JP | S62-110202 | 5/1987 |
| JP | A-H01-220893 | 9/1989 |
| JP | H02-110903 | 4/1990 |
| JP | A-H04-147695 | 5/1992 |
| JP | A-H05-75260 | 3/1993 |
| JP | A-H06-232558 | 8/1994 |
| JP | H06-336562 | 12/1994 |
| JP | A-H07-176846 | 7/1995 |
| JP | A-8-018240 | 1/1996 |
| JP | A-H08-148828 | 6/1996 |
| JP | 09-055583 * | 2/1997 |
| JP | A-H09-055583 | 2/1997 |
| JP | A-H9-19935 | 7/1997 |
| JP | A-H9-199635 | 7/1997 |
| JP | 0 957 513 A1 | 11/1997 |
| JP | A-H10-081857 | 3/1998 |
| JP | WO 98/47331 | 10/1998 |
| JP | A-H11-168282 | 6/1999 |
| JP | 0 987 748 A2 | 9/1999 |
| JP | A-2000-200976 | 7/2000 |
| JP | A-2001-036253 | 2/2001 |
| KR | 0173234 | 10/1998 |

OTHER PUBLICATIONS

Notification of Reasons for Rejection from Japanese Patent Office issued on Feb. 21, 2006 for the corresponding Japanese patent application No. 2001-179117 (a copy and English translation thereof).

* cited by examiner

MANUFACTURING METHOD FOR A PRINTED CIRCUIT BOARD

This application is a divisional application of U.S. patent application Ser. No. 10/163,998, now U.S. Pat. No. 6,818,836, which is based on and incorporates herein by reference Japanese Patent Application No. 2001-179117, filed on Jun. 13, 2001.

BACKGROUND OF THE INVENTION

The present invention relates to a printed circuit board and its manufacturing method. More particularly, the present invention relates to a so-called composite printed circuit board which comprises resin substrates laminated on a ceramic substrate and also relates to a manufacturing method of the composite printed circuit board.

A so-called composite printed circuit board, comprising resin substrates laminated on a ceramic substrate, is conventionally known as a printed circuit board which is capable of assuring excellent heat radiation and other thermal properties as well as realizing high-density electric component mounting.

The composite printed circuit board is manufactured in the following manner.

First, a uncured state heat-hardening resin (e.g., a polyimide resin or the like) is coated on a ceramic member (i.e., a ceramic substrate) on which a printed conductor pattern and a printed resistor are formed. Next, a laser beam is applied to a predetermined portion on a heat-hardening resin layer to open a via-hole so as to extend across this resin layer. Then, a conductor pattern and a via are formed on or in the heat-hardening resin layer by plating or sputtering.

When a plurality of resin substrates are laminated, another uncured state heat-hardening resin is coated on the hardened heat-hardening resin. Then, the above-described processes are repeated to obtain a composite printed circuit board having a desired number of resin layers.

However, the above-described conventional technique requires a large number of manufacturing processes starting from the step of coating the uncured state heat-hardening resin on the ceramic substrate to the step of forming the conductor pattern and the via. When the required number of layers constituting the composite printed circuit board is large, similar steps must be repeated to build up the layers. The manufacturing processes become very complicate.

SUMMARY OF THE INVENTION

In view of the foregoing problems of the prior art, the present invention has an object to provide a printed circuit board and its manufacturing method which is capable of simplifying manufacturing processes even if a large number of resin layers are laminated on a ceramic substrate.

In order to accomplish the above and other related objects, the present invention provides a printed circuit board comprising a ceramic substrate and a resin base layer integrally laminated on said ceramic substrate, wherein the resin base layer is formed by pressing and heating a laminated body consisting of a conductor pattern forming film and said ceramic substrate, and the conductor pattern forming film includes a resin film made of a thermoplastic resin and a conductor pattern formed on a surface of said resin film.

According to this arrangement, the resin base layer is formed by the resin film made of a thermoplastic resin. The resin film and the ceramic substrate are pressed and heated together to obtain the resin base layer formed integrally on the ceramic substrate.

The required processing time can be reduced. When a plurality of layers are laminated, these layers are bonded at a time by heating and pressing them together. Thus, the present invention simplifies the manufacturing processes of a printed circuit board.

According to the printed circuit board of the present invention, it is preferable that the thermoplastic resin has an elastic coefficient in a range of 1~1,000 MPa in a temperature level during the heat and press treatment.

According to this arrangement, the resin film and the ceramic substrate can be surely bonded together by performing the press treatment under the condition that the elastic coefficient of resin film is sufficiently lowered to the range of 1~1,000 MPa.

More specifically, it is preferable that the conductor pattern forming film is a single-sided conductor pattern film having the conductor pattern formed on only one surface of the resin film.

According to this arrangement, when a plurality of conductor pattern forming films are laminated, it is not necessary to prepare and process a plurality of different kinds of conductor pattern forming films. The manufacturing processes can be further simplified.

Furthermore, it is preferable that the ceramic substrate comprises a printed conductor pattern and a printed electric element which are connected to each other and formed on a surface the ceramic substrate to which the conductor pattern forming film is bonded, the printed conductor pattern being formed by printing a conductor forming paste and then sintering the conductor forming paste while the printed electric element being formed by printing an electric element forming paste so as to be connected to the conductor forming paste and then sintering the electric element forming paste, and the printed conductor pattern is connected to the conductor pattern formed on the resin film via an electrically conductive paste which is filled in a via-hole extending across the resin film.

This arrangement makes it possible to embed the printed electric element along a bonding surface between the ceramic substrate and the conductor pattern forming film. It is, hence, possible to reduce the total number of electric elements to be mounted on the outermost surface of the printed circuit board. This leads to the downsizing of the printed circuit board.

Furthermore, it is preferable that the ceramic substrate comprises only a printed electric element formed on a surface to which the conductor pattern forming film is bonded, the printed electric element being formed by printing an electric element forming paste and then sintering the electric element forming paste, and the printed electric element is connected to the conductor pattern formed on the resin film via an electrically conductive paste which is filled in a via-hole extending across the resin film.

This arrangement makes it possible to embed the printed electric element along a bonding surface between the ceramic substrate and the conductor pattern forming film. It is, hence, possible to reduce the total number of electric elements to be mounted on the outermost surface of the printed circuit board. This leads to the downsizing of the printed circuit board. In addition, there is no necessity of forming the printed conductor pattern on the surface of the ceramic substrate on which the conductor pattern forming film is bonded. The manufacturing processes can be further simplified.

The present invention provides a method for manufacturing a printed circuit board. In a laminating step, a conductor pattern forming film and a ceramic substrate are laminated. The conductor pattern forming film includes a resin film made of a thermoplastic resin and a conductor pattern formed on a surface of the resin film. In a bonding step, the conductor pattern forming film and the ceramic substrate are bonded by heating and pressing from both sides of a laminated body of the conductor pattern forming film and the ceramic substrate, thereby obtaining a resin base layer integrally laminated on the ceramic substrate.

The manufacturing method of this invention makes it possible to reduce the required processing time. When a plurality of layers are laminated, these layers are bonded at a time by heating and pressing them together. Thus, the present invention simplifies the manufacturing processes of a printed circuit board.

Furthermore, it is preferable that the conductor pattern contains at least one metal component and the bonding step is performed at a temperature level not lower than 250° C. where the elastic coefficient of the thermoplastic resin constituting the resin film is in a range of 1~1,000 MPa.

According to this manufacturing method, the resin film and the ceramic substrate can be surely bonded together in the bonding step by performing the press treatment under the condition that the elastic coefficient of resin film is sufficiently lowered to the range of 1~1,000 MPa. Furthermore, increasing the temperature to 250° C. or above is effective to improve the surface activity of the metal component contained in the conductor pattern. Hence, the conductor pattern and the resin film are surely bonded together when the conductor pattern is pressed against the resin film which has a sufficiently lowered elastic coefficient.

More specifically, it is preferable that the conductor pattern forming film is a single-sided conductor pattern film having the conductor pattern formed on only one surface of the resin film.

According to this arrangement, when a plurality of conductor pattern forming films are laminated, it is not necessary to prepare and process a plurality of different kinds of conductor pattern forming films. The manufacturing processes can be further simplified.

Furthermore, it is preferable that the manufacturing method for a printed circuit board further comprises the following steps.

In printed conductor pattern forming step, a printed conductor pattern is formed before performing the laminating step. The printed conductor pattern is formed by printing a conductor forming paste on a surface of the ceramic substrate on which the conductor pattern forming film is bonded in the bonding step and then by sintering the conductor forming paste. In a printed electric element forming step, a printed electric element is formed before performing the laminating step. The printed electric element is formed by printing an electric element forming paste so as to be connected to the conductor forming paste on a surface of the ceramic substrate on which the conductor pattern forming film is bonded in the bonding step and then by sintering the electric element forming paste. And, in a filling step, an electrically conductive paste is charged into an end-closed via-hole before performing the laminating step. The end-closed via-hole extends across the conductor pattern forming film and has a bottom defined by the conductor pattern formed on the conductor pattern forming film.

Then, through the bonding step, the electrically conductive paste filled in the end-closed via-hole provides an electric connection between the conductor pattern formed on the conductor pattern forming film and the printed conductor pattern formed on the ceramic substrate.

This manufacturing method makes it possible embed the printed electric element along a bonding surface between the ceramic substrate and the conductor pattern forming film. It is, hence, possible to reduce the total number of electric elements to be mounted on the outermost surface of the printed circuit board. This leads to the downsizing of the printed circuit board.

Alternatively, it is preferable that the manufacturing method for a printed circuit board further comprises the following steps. In a printed electric element forming step, a printed electric element is formed before performing the laminating step. The printed electric element is formed by printing an electric element forming paste on a surface of the ceramic substrate on which the conductor pattern forming film is bonded in the bonding step and then by sintering the electric element forming paste. And, in a filling step, an electrically conductive paste is charged into an end-closed via-hole before performing the laminating step. The end-closed via-hole extends across the conductor pattern forming film and has a bottom defined by the conductor pattern formed on the conductor pattern forming film.

Then, through the bonding step, the electrically conductive paste filled in the end-closed via-hole provides an electric connection between the conductor pattern formed on the conductor pattern forming film and the printed conductor pattern formed on the ceramic substrate.

This manufacturing method makes it possible to embed the printed electric element along a bonding surface between the ceramic substrate and the conductor pattern forming film. It is, hence, possible to reduce the total number of electric elements to be mounted on the outermost surface of the printed circuit board. This leads to the downsizing of the printed circuit board. In addition, there is no necessity of forming the printed conductor pattern on the surface of the ceramic substrate on which the conductor pattern forming film is bonded. The manufacturing processes can be further simplified.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Preferred embodiments of the present invention will be explained hereinafter with reference to attached drawings. Identical parts are denoted by the same reference numerals throughout the drawings.

Hereinafter, a preferred embodiment of the present invention will be explained with reference to the attached drawing.

FIGS. 1A to 1H are cross-sectional views explaining manufacturing steps of a printed circuit board in accordance with a preferred embodiment of the present invention.

Figure 1A:
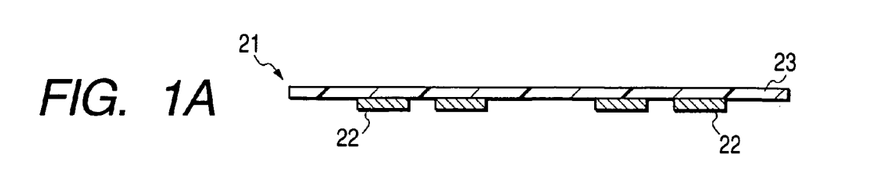
FIGS. 1A through 1H are cross-sectional views respectively explaining essential manufacturing processes for manufacturing a printed circuit board in accordance with a preferred embodiment of the present invention.

FIG. 1A shows a single-sided conductor pattern film 21 which comprises a conductor pattern 22 formed on a resin film 23. The conductor pattern 22 has a predetermined pattern which is configured by etching a conductor foil (e.g., a copper foil having a thickness of 18 µm according to this embodiment) adhered on a surface of a resin film 23. The resin film 23 serves as an insulating material. According to this embodiment, the resin film 23 is a thermoplastic resin film made of a polyether ether ketone resin of 65~35 weight % and a polyetherimide resin of 35~65 weight %. The resin film 23 is 25~75 µm in thickness. The single-sided conductor pattern film 21 is a conductor pattern forming film of the present invention.

Figure 1B:
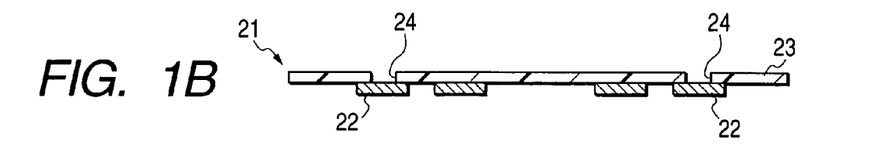

After forming the conductor pattern 22 shown in FIG. 1A, a carbon dioxide gas laser is irradiated on a surface of resin film 23 on which no conductor pattern 22 is formed. As shown in FIG. 1B, the irradiation of a carbon dioxide gas laser forms via-holes 24. The via-hole 24 is an end-closed via-hole which has a bottom. The bottom of via-hole 24 is defined by the conductor pattern 22. In the process of forming the via-hole 24, the carbon dioxide gas laser is precisely controlled in the output power as well as in the irradiation time so as to prevent the via-hole 24 from expanding into the region of conductor pattern 22.

Besides the carbon dioxide gas laser, an excimer laser can be used for forming the via-hole 24. Furthermore, it may be also possible to use a drilling or other machining technique to form the via-hole 24. However, using a laser is advantageous in that the size of via-hole 24 can be accurately controlled and accordingly no damage is given to the conductor pattern 22.

Figure 1C:
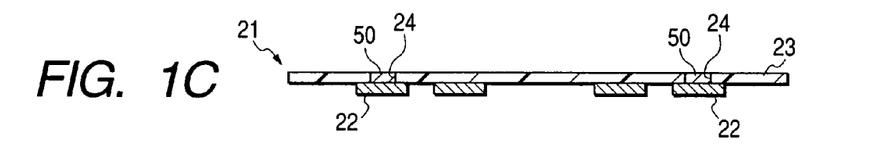

After accomplishing the formation of via-hole 24 as shown in FIG. 1B, each via-hole 24 is filled with an electrically conductive paste 50 which serves as an interlayer bond material as shown in FIG. 1C. In this case, to obtain the electrically conductive paste 50, tin grains of 300 g and silver grains of 300 g are mixed with terpineol of 60 g. Tin grains have an average grain diameter of 5 µm and a specific surface (i.e., area/weight ratio) of 0.5 $m^2/g$. Silver grains have an average grain diameter of 1 µm and a specific surface (i.e., area/weight ratio) of 1.2 $m^2/g$. Terpineol is an organic solvent. The mixed grains and organic solvent are then kneaded in a mixer to obtain a paste.

The electrically conductive paste 50 is charged into the via-holes 24 of single-sided conductor pattern film 21 by a screen printing machine. Then, the electrically conductive paste 50 of via-holes 24 is left in an atmosphere of 140~160° C. for approximately 30 minutes to dry the terpineol. Regarding the filling of electrically conductive paste 50 into the via-holes 24, this embodiment uses the screen printing machine. However, another method using a dispenser will be also employable to fill the electrically conductive paste 50 into the via-holes 24, if the filling operation is accurately accomplished.

Terpineol can be replaced by other organic solvent. It is preferable that the organic solvent, added with the metal grains for obtaining the electrically conductive paste 50, has a boiling point of 150~300° C. If the used organic solvent has a boiling point less than 150° C., the viscosity of electrically conductive paste 50 will vary largely with elapsing time. If the used organic solvent has a boiling point larger than 300° C., it will take a long time to dry this organic solvent.

Furthermore, as metal grains for constituting the electrically conductive paste 50, this embodiment uses the tin grains having the average grain diameter of 5 µm and the specific surface of 0.5 $m^2/g$ and the silver grains having the average grain diameter of 1 µm and the specific surface of 1.2 $m^2/g$. It is preferable for these metal grains that the average grain diameter is in a range from 0.5 µm to 20 µm and the specific surface is in a range from 0.1 $m^2/g$ to 1.5 $m^2/g$.

If the average grain diameter of these metal grains is less than 0.5 µm or when the specific surface of these metal grains exceeds 1.5 $m^2/g$, a great amount of organic solvent will be required to obtain a paste having a viscosity preferable for filling the via-hole. When the electrically conductive paste contains a great amount of organic solvent, it takes a long time to dry the organic solvent. If the drying treatment ends dissatisfactorily, a great amount of gas will be generated during a heating treatment for bonding the layers. Voids will easily appear in the via-hole 24. This will deteriorate the reliability with respect to the interlayer bondability.

On the other hand, if the average grain diameter of these metal grains exceeds 20 µm or when the specific surface of these metal grains is less than 0.1 $m^2/g$, the filling of electrically conductive paste 50 into the via-hole 24 will become difficult. The metal grains will spread non-uniformly. Even if they are heated, it will be difficult to form a later-described electrically conductive composition 51 which is a uniform alloy. The reliability with respect to the interlayer bondability will not be assured.

Furthermore, before filling the electrically conductive paste 50 into the via-hole 24, it is preferable to apply an etching treatment slightly on the conductor pattern 22 at a portion facing to the via-hole 24. Furthermore, it is also preferable to apply a reducing treatment on the conductor pattern 22 at the portion facing to the via-hole 24. These treatments will lead to successful formation of a later-described via connection.

Figure 1D:
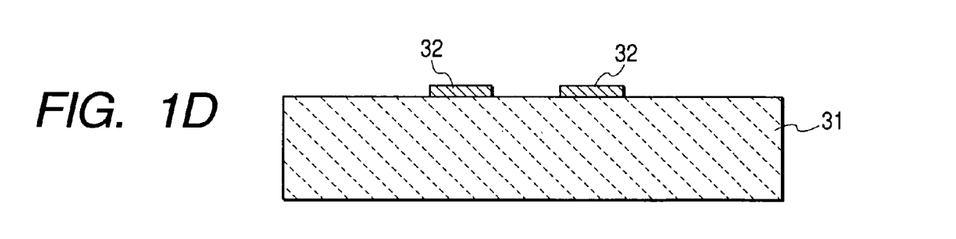

FIG. 1D shows a ceramic substrate 31 which is 0.6~1.0 mm in thickness. A conductor forming paste is pattern printed on an upper surface of ceramic substrate 31. Then, the conductor forming paste is sintered to form a printed conductor pattern 32.

According to this embodiment, the printed conductor pattern 32 is formed in the following manner. The conductor forming paste is fabricated by kneading silver grains and glass grains with organic solvent. The obtained conductor forming paste is then heated at the temperature of 600~900° C. for approximately 60 minutes, thereby forming the printed conductor pattern 32. According to this embodiment, silver grains are the metal grains added to the conductor forming paste. However, it is preferable to mix platinum grains and palladium grains with the silver grains. It is also possible to use copper grains or gold grains instead of using the silver grains.

Figure 1E:
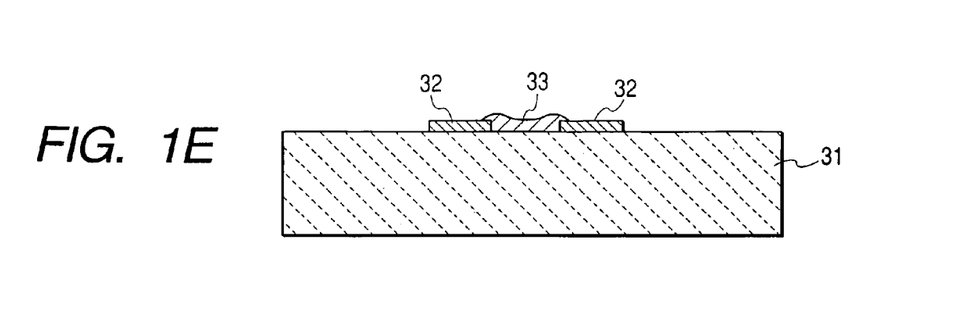

After forming the printed conductor pattern 32 as shown in FIG. 1D, a resistor forming paste is pattern printed on an upper surface of ceramic substrate 31. The resistor forming paste straddles between predetermined portions of printed conductor pattern 32 and is sintered to form a printed resistor 33 as shown in FIG. 1E. The printed resistor 33 is a printed electric element.

According to this embodiment, the resistor forming paste is fabricated by kneading ruthenium dioxide ($RuO_2$) grains and glass grains with organic solvent. The obtained resistor forming paste is then heated at the temperature of 600~900° C. for approximately 60 minutes, thereby forming the printed resistor 33.

According to this embodiment, ruthenium dioxide is the resistor grains added to the resistor forming paste. However, it is preferable to use silica ($SiO_2$) grains or lanthanum boride (LaB6) grains. Furthermore, the printed electric element can be formed by printing and sintering an electric element of a capacitor.

Furthermore, it is preferable to apply a laser trimming to the thus formed printed resistor 33 if necessary to accurately adjust the resistance value of printed resistor 33.

Figure 1F:
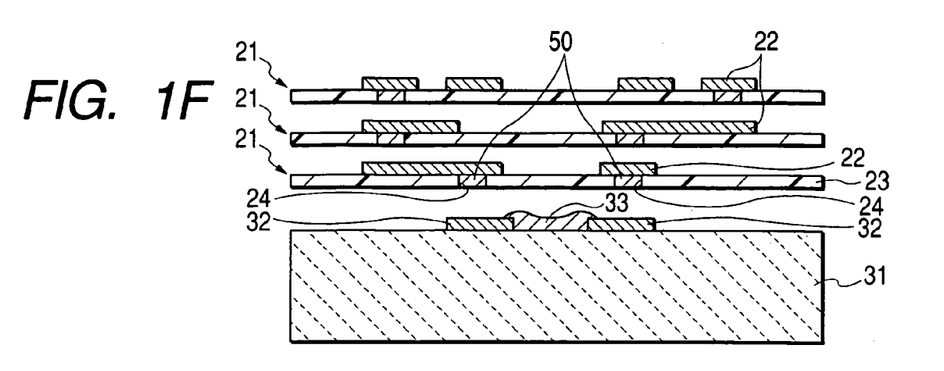

After finishing the filling of electrically conductive paste 50 into the via-holes 24 of single-sided conductor pattern film 21 as shown in FIG. 1C and the forming of printed resistor 33 on the ceramic substrate 31 as shown in FIG. 1E, a plurality of (e.g., a total of three according to this embodiment) single-sided conductor pattern films 21 and are stacked on the ceramic substrate 31 as shown in FIG. 1F.

In this case, the conductor patterns 22 of respective single-sided conductor pattern films 21 face upward when mounted on the ceramic substrate 31. In other words, the single-sided conductor pattern films 21 are laminated in such a manner that a face of a single-sided conductor pattern film 21 having no conductor pattern 22 confronts with a face of adjacent single-sided conductor pattern film 21 having the conductor pattern 22 formed thereon.

The ceramic substrate 31 is positioned below the multilayered single-sided conductor pattern films 21, with the printed conductor pattern 32 and the printed resistor 33 facing upward. The lowermost single-sided conductor pattern film 21 is mounted on the ceramic substrate 31 in such a manner that the via-holes 24 of resin film 23 are positioned just above the printed conductor pattern 32. Through this positioning, the via-holes 24 are electrically connected to predetermined portions of the printed conductor pattern 32.

After stacking the single-sided conductor pattern films 21 on the ceramic substrate 31 as shown in FIG. 1F, a pressing force is applied to the multilayered assembly in the up-and-down by a heating under vacuum press machine while the multilayered assembly is kept in a predetermined high temperature. According to this embodiment, the multilayered assembly is heated up to the temperature level of 250~350° C. and is pressed under a pressing force of 1~10 MPa for 10~20 minutes.

Figure 1G:
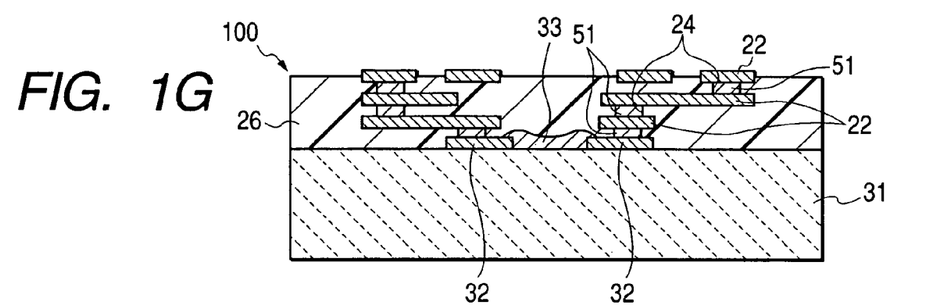

Through the above heating under vacuum treatment, respective single-sided conductor pattern films 21 and the ceramic substrate 31 are mutually bonded as shown in FIG. 1G. The resin films 23 are made of the same thermoplastic resin material. Therefore, the resin films 23 easily fuse and integrate together into a resin base layer 26.

Furthermore, the electrically conductive paste 50 is sintered in the via-hole 24 and turns into the electrically conductive composition 51. The electrically conductive composition 51 provides the interlayer connection between adjacent conductor patters 22. Furthermore, the electrically conductive composition 51 provides the connection between the conductor pattern 22 and the printed conductor pattern 32 which is connected to the printed resistor 33, thereby obtaining a multilayered printed circuit board 100 with the printed resistor 33 embedded therein. In this case, the electrically conductive composition 51 is an interlayer bond material. The electrically conductive composition 51 and the via-hole 24 cooperatively constitute a via.

The interlayer bonding mechanism of conductor patterns 22 will be simply explained hereinafter.

The electrically conductive paste 50 filled and dried in the via-hole 24 contains the mixture of tin grains and silver grains. The melting point of tin grains is 232° C. while the melting point of silver grains is 961° C. Hence, when the electrically conductive paste 50 is heated up to the temperature level of 250~350° C., the tin grains melt and adhere around the silver grains.

Continuing the heating treatment in this condition makes the molten tin start diffusing from the surface of silver grains. As a result, an alloy of tin and silver (having a melting point of 480° C.) is formed. In this case, the pressing force of 1~10 MPa is applied on the electrically conductive paste 50. In accordance with the formation of an alloy of tin and silver, the electrically conductive composition 51 is formed in the via-hole 24. The electrically conductive composition 51 consists of the integrated alloy obtained through a sintering treatment.

During the formation of electrically conductive composition 51 in the via-hole 24, the electrically conductive composition 51 is subjected to a pressing force and is therefore pressed against the bottom of via-hole 24 which is a surface of conductor pattern 22. Under this condition, the solid-phase diffusion occurs between the tin components contained in electrically conductive composition 51 and the copper compositions of a copper foil constituting the conductor pattern 22. Thus, a solid-phase diffusion layer is formed in the boundary thereof. The thus formed solid-phase diffusion layer provides an electrical connection between the electrically conductive composition 51 and the conductor pattern 22.

Furthermore, due to sintering treatment applied to the previously described conductor forming paste, the printed conductor pattern 32 has a glass-rich region near the boundary between the printed conductor pattern 32 and the ceramic substrate 31. The glass-rich region contains rich glass components. On the other hand, the printed conductor pattern 32 has a silver-rich region at the opposite surface side. The glass-rich region contains rich glass components. Like the above-described interlayer bonding mechanism between the conductor patterns 22, an electric connection is provided between the conductor pattern 22 and the printed conductor pattern 32 through a path consisting of the solid-phase diffusion layer formed between the conductor pattern 22 and the electrically conductive composition 51, the electrically conductive composition 51 extending in the via-hole 24, and the solid-phase diffusion layer formed between the electrically conductive composition 51 and the printed conductor pattern 32.

When the resin film 23 is pressed and heated by the heating under vacuum press machine, the elastic coefficient of resin film 23 is reduced to a level of approximately 5~40 MPa. The conductor pattern 22, the printed conductor pattern 32, and the electrically conductive composition 51 have improved activity when they are heated up to 250° C. or above. Accordingly, respective resin films 23 and the ceramic substrate 31 are surely bonded together, while the conductor patterns 22, the printed conductor pattern 32, the electrically conductive composition 51, and the resin film 23 are surely bonded.

It is preferable that the elastic coefficient of resin film 23 is in a range from 1 MPa to 1,000 MPa during the heating and pressing treatment. If the elastic coefficient of resin film 23 exceeds 1,000 MPa, no thermal fusion will occur between resin films 23. The conductor patterns 22 will be subjected to a large stress and may be broken or damaged. On the other hand, if the elastic coefficient of resin film 23 is lower than 1 MPa, the resin film 23 will not be able to keep its shape during the heating and pressing treatment. This causes the drift of conductor patterns 22 and makes it difficult to form the printed circuit board 100.

Figure 1H:
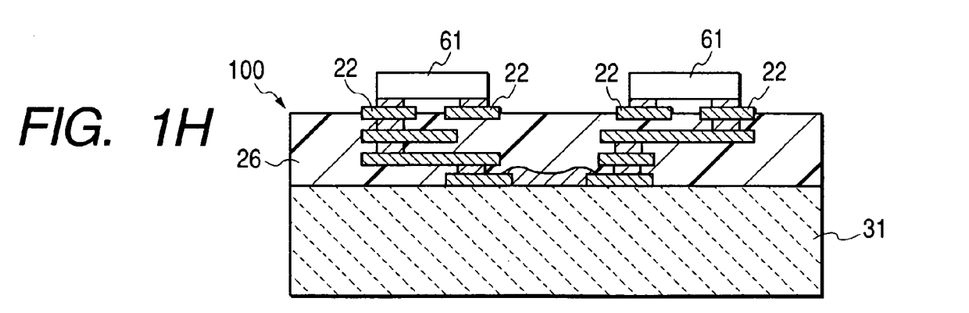

After obtaining the printed circuit board 100 as described above, flip chip elements or other package parts 61 are mounted on predetermined portions of the conductor pattern 22 formed on the upper surface of printed circuit board 100 as shown in FIG. 1H. The mounted package parts 61 are then soldered to accomplish the mounting of packaged parts.

Furthermore, in the above-described manufacturing method, the process shown in FIG. 1C corresponds to a filling step of this embodiment. The process shown in FIG. 1D corresponds to a printed conductor pattern forming step of this embodiment. The process shown in FIG. 1E corresponds to a printed electric element forming step of this embodiment. The process shown in FIG. 1F corresponds to a laminating step of this embodiment. Furthermore, the process of heating and pressing the laminated body shown in FIG. 1F to form the printed circuit board 100 shown in FIG. 1G corresponds to a bonding step of this embodiment.

According to the above-described arrangement and manufacturing method, a plurality of single-sided conductor pattern films 21 and the ceramic substrate 31 are laminated together. The laminated body is heated and pressed from both sides thereof, thereby bonding respective resin films 23 and the ceramic substrate 31 at a time. As a result, the laminated resin films 23 turn into the resin base layer 26 positioned on the ceramic substrate 31. Thus, it becomes possible to obtain the printed circuit board 100 which is a so-called multilayered composite substrate. As apparent from the foregoing description, this embodiment provides a novel manufacturing method for a printed circuit board which is simple compared with a conventional method.

Furthermore, the single-sided conductor pattern films 21 laminated on the ceramic substrate 31 have the same arrangement. This is advantageous in that the manufacturing processes can be simplified because there is no necessity of preparing and processing a plurality kinds of conductor pattern forming films.

Furthermore, the printed circuit board 100 includes the ceramic substrate 31 at the lower side thereof. As shown in FIG. 1H, it becomes possible to mount the electric element 61 on the upper surface of printed circuit board 100. The printed resistor 33 is embedded in the printed circuit board 100. It becomes possible to provide a printed circuit board which is capable of assuring excellent heat radiation and other thermal properties as well as realizing high-density electric component mounting.

Furthermore, according to the package mounting structure shown in FIG. 1H, the ceramic substrate 31 and the flip chip elements or other package parts 61 are positioned at both sides of the printed circuit board 100. Each of the ceramic substrate 31 and the package parts 61 has a rigidity higher than that of the resin base layer 26. The ceramic substrate 31 and the package parts 61 have similar thermal expansion coefficients. This is effective to realize an excellent package mounting free from any concentrated stress occurring due to heat generation.

As apparent from the foregoing description, the above-described one preferable embodiment of the present invention provides a printed circuit board comprising a ceramic substrate (31) and a resin base layer (26) integrally laminated on the ceramic substrate (31), wherein the resin base layer (26) is formed by pressing and heating a laminated body consisting of a conductor pattern forming film (21) and the ceramic substrate (31), and the conductor pattern forming film (21) includes a resin film (23) made of a thermoplastic resin and a conductor pattern (22) formed on a surface of the resin film (23).

According to the printed circuit board disclosed in above-described one preferable embodiment of the present invention, it is preferable that the thermoplastic resin has an elastic coefficient in a range of 1~1,000 MPa in a temperature level during the heat and press treatment. The conductor pattern forming film (21) is a single-sided conductor pattern film (21) having the conductor pattern (22) formed on only one surface of the resin film (23). The ceramic substrate (31) comprises a printed conductor pattern (32) and a printed electric element (33) which are connected to each other and formed on a surface of the ceramic substrate (31) to which the conductor pattern forming film (21) is bonded. The printed conductor pattern (32) is formed by printing a conductor forming paste and then sintering the conductor forming paste, while the printed electric element (33) is formed by printing an electric element forming paste so as to be connected to the conductor forming paste and then sintering the electric element forming paste. And, the printed conductor pattern (32) is connected to the conductor pattern (22) formed on the resin film (23) via an electrically conductive paste (50) which is filled in a via-hole (24) extending across the resin film (23).

The above-described one preferable embodiment of the present invention provides a method for manufacturing a printed circuit board comprising a laminating step of laminating a conductor pattern forming film (21) and a ceramic substrate (31), the conductor pattern forming film (21) including a resin film (23) made of a thermoplastic resin and a conductor pattern (22) formed on a surface of the resin film (23). Furthermore, this manufacturing method comprises a bonding step of bonding the conductor pattern forming film (21) and the ceramic substrate (31) by heating and pressing from both sides of a laminated body of the conductor pattern forming film (21) and the ceramic substrate (31), thereby obtaining a resin base layer (26) integrally laminated on the ceramic substrate (31).

According to the manufacturing method of a printed circuit board disclosed in above-described one preferable embodiment of the present invention, it is preferable that the conductor pattern (22) contains at least one metal component and the bonding step is performed at a temperature level not lower than 250° C. where the elastic coefficient of the thermoplastic resin constituting the resin film (23) is in a range of 1~1,000 MPa. The conductor pattern forming film (21) is a single-sided conductor pattern film (21) having the conductor pattern (22) formed on only one surface of the resin film (23).

Preferably, the disclosed printed circuit board manufacturing method further comprises a printed conductor pattern forming step of forming a printed conductor pattern (32) before performing the laminating step. The printed conductor pattern (32) is formed by printing a conductor forming paste on a surface of the ceramic substrate (31) on which the conductor pattern forming film (21) is bonded in the bonding step and then by sintering the conductor forming paste.

The disclosed printed circuit board manufacturing method further comprises a printed electric element forming step of forming a printed electric element (33) before performing the laminating step. The printed electric element (33) is formed by printing an electric element forming paste so as to be connected to the conductor forming paste on a surface of the ceramic substrate (31) on which the conductor pattern forming film (21) is bonded in the bonding step and then by sintering the electric element forming paste.

The disclosed printed circuit board manufacturing method further comprises a filling step of charging an electrically conductive paste (50) into an end-closed via-hole (24) before performing the laminating step. The end-closed via-hole (24) extends across the conductor pattern forming film (21) and has a bottom defined by the conductor pattern (22) formed on the conductor pattern forming film (21).

Then, in the bonding step, the electrically conductive paste (50) filled in the end-closed via-hole (24) provides an electric connection between the conductor pattern (22) formed on the conductor pattern forming film (21) and the printed conductor pattern (32) formed on the ceramic substrate (31).

According to the above-described one embodiment, in the manufacturing of a printed circuit board, the printed conductor pattern 32 is formed on the ceramic substrate 31 as shown in FIG. 1D. Then, the printed resistor 33 is formed on the ceramic substrate 31 as shown in FIG. 1E. It is however preferable to form only the printed electric elements, including the printed resistor 33, on the ceramic substrate 31 without forming any printed conductor pattern.

Figure 2:
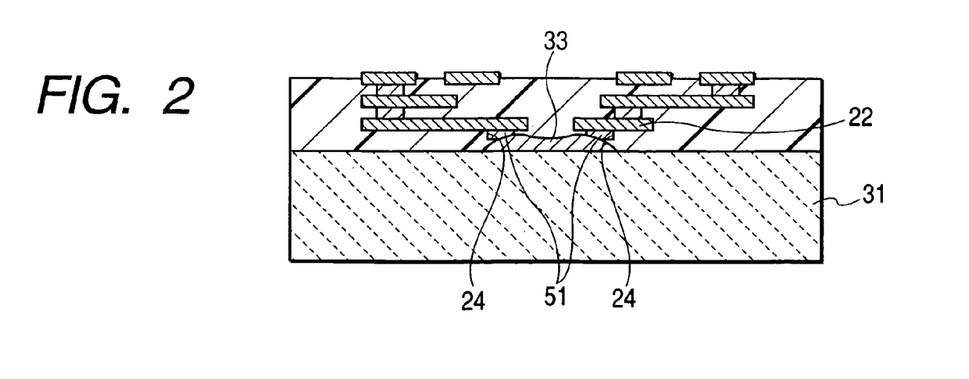
FIG. 2 is a cross-sectional view showing a printed circuit board in accordance with another embodiment of the present invention.

In this case, the lowermost single-sided conductor pattern film 21 is brought into contact with the ceramic substrate 31. In the laminating process, the lowermost single-sided conductor pattern film 21 is positioned on the ceramic substrate 31 in such a manner that electric connection is provided between the via-holes 24 of the resin film 23 and the printed resistor 33. Then, by applying heating press, the conductor pattern 22 is electrically connected to the printed resistor 33 via the electrically conductive composition 51 (i.e., a composition obtained through the sintering treatment of electrically conductive paste 50) as shown in FIG. 2.

According to this embodiment, it becomes possible to omit the printed conductor pattern forming process which is required in the above-described one embodiment. The manufacturing processes can be further simplified.

Namely, the ceramic substrate (31) comprises only a printed electric element (33) formed on a surface of the ceramic substrate (31) to which the conductor pattern forming film (21) is bonded. The printed electric element (33) is formed by printing an electric element forming paste and then sintering the electric element forming paste. And, the printed electric element (33) is connected to the conductor pattern (22) formed on the resin film (23) via an electrically conductive paste (50) which is filled in a via-hole (24) extending across the resin film (23).

This embodiment provides another manufacturing method of a printed circuit board comprising a printed electric element forming step of forming a printed electric element (33) before performing the laminating step. The printed electric element (33) is formed by printing an electric element forming paste on a surface of the ceramic substrate (31) on which the conductor pattern forming film (21) is bonded in the bonding step and then by sintering the electric element forming paste.

This another printed circuit board manufacturing method comprises a filling step of charging an electrically conductive paste (50) into an end-closed via-hole (24) before performing the laminating step. The end-closed via-hole (24) extends across the conductor pattern forming film (21) and has a bottom defined by the conductor pattern (22) formed on the conductor pattern forming film (21). Then, In the bonding step, the electrically conductive paste (50) filled in the end-closed via-hole (24) provides an electric connection between the conductor pattern (22) formed on the conductor pattern forming film (21) and the printed conductor pattern (32) formed on the ceramic substrate (31).

According to the above-described one embodiment, the resin film 23 is made of a polyether ether ketone resin of 65~35 weight % and a polyetherimide resin of 35~65 weight %. However, the resin film of this invention is not limited to the disclosed one. For example, the resin film 23 can be made of a film containing a non-conductive filler added to a polyether ether ketone resin and a polyetherimide resin. It is also possible to form the resin film 23 by using only the polyether ether ketone (PEEK) or the polyetherimide (PEI).

Furthermore, it is possible to use a thermoplastic polyimide, a so-called liquid crystal polymer or other thermoplastic resin. It is desirable that the used resin film has an elastic coefficient in a range from 1~1,000 MPa and possesses sufficient heat resistance required in the soldering process (i.e., in the post-processing).

Furthermore, according to the above-described one embodiment, the conductor pattern 22 is pattern formed by etching a conductor foil. However, the conductor pattern 22 can be pattern formed by using an electrically conductive paste containing metal components.

Furthermore, according to the above-described embodiment, the ceramic substrate 31 extends entirely along one side of printed circuit board 100. However, it is possible to form the ceramic substrate 31 as a part of one surface of the printed circuit board 100. It is also possible to provide the ceramic substrate 31 on both surfaces of the printed circuit board 100. It is also possible to form a resin base layer by bonding the conductor pattern forming film on both surfaces of the ceramic substrate 31.

Moreover, according to each of the above-described embodiments, the printed circuit board 100 is formed by laminating a total of four substrates. However, the total number of laminated layers is not limited to a specific value.

What is claimed is:

1. A method for manufacturing a printed circuit board comprising:

a forming step of forming a conductor pattern on a surface of a resin film made of a thermoplastic resin while forming a via-hole in said resin film to form each of a plurality of conductor pattern forming films, each conductor pattern forming film including said resin film and said conductor pattern with said via-hole;

a filling step of filling said via-holes formed in said resin films with conductive paste formed of tin grains and silver grains mixed with an organic solvent;

a preparing step of preparing a ceramic substrate;

a laminating step of laminating said conductor pattern forming films and said ceramic substrate to obtain a laminated body; and a bonding step of bonding said conductor pattern forming films and said ceramic substrate by heating and pressing said conductor pattern forming films and said ceramic substrate from both sides of said laminated body to obtain a resin base layer integrally laminated on said ceramic substrate such that said conductor patterns formed on each pair of resin films adjacent to each other are electrically connected with each other through said conductive paste filled in one of said resin films, wherein:

said forming step includes forming each via-hole which has a bottom defined by said corresponding conductor pattern, said preparing step includes printing and sintering a conductor paste on a flat surface of said ceramic substrate to form a printed resistor and a printed conductor pattern connected with said printed resistor on said flat surface of said ceramic substrate, said laminating step includes laminating said conductor pattern forming films and said ceramic substrate so as to place said printed resistor and said printed conductor pattern between said ceramic substrate and one of said conductor pattern forming films, and said bonding step includes fusing and integrating said resin films of said conductor pattern forming films into a resin base layer so as to cover said printed resistor and said printed conductor pattern formed on said ceramic substrate with said thermoplastic resin of said resin base layer such that said printed conductor pattern is electrically connected with the conductor patterns of said conductor pattern forming films only through said conductive paste filled into said via-holes.

2. The manufacturing method for a printed circuit board in accordance with claim 1, wherein said conductor pattern contains at least one metal component and said bonding step is performed at a temperature level not lower than 250degree C. where the elastic coefficient of said thermoplastic resin constituting said resin film is in a range of 1about 1,000 MPa.

3. The manufacturing method for a printed circuit board in accordance with claim 1, wherein said conductor pattern forming film is a single-sided conductor pattern film having said conductor pattern formed on only one surface of said resin film.

4. The manufacturing method for a printed circuit board in accordance with claim 1, further comprising:

a printed conductor pattern forming step of forming a printed conductor pattern before performing said laminating step, said printed conductor pattern being formed by printing a conductor forming paste on a surface of said ceramic substrate on which said conductor pattern forming film is bonded in said bonding step and then by sintering said conductor forming paste;

a printed electric element forming step of forming a printed electric element before performing said laminating step, said printed electric element being formed by printing an electric element forming paste so as to be connected to said conductor forming paste on a surface of said ceramic substrate on which said conductor pattern forming film is bonded in said bonding step and then by sintering said electric element forming paste; and a filling step of charging an electrically conductive paste into an end-closed via-hole before performing said laminating step, said end-closed via-hole extending across said conductor pattern forming film and having a bottom defined by said conductor pattern formed on said conductor pattern forming film, wherein in said bonding step said electrically conductive paste filled in said end-closed via-hole provides an electric connection between said conductor pattern formed on said conductor pattern forming film and said printed conductor pattern formed on said ceramic substrate.

5. The manufacturing method for a printed circuit board in accordance with claim 1, further comprising:

a printed electric element forming step of forming a printed electric element before performing said laminating step, said printed electric element being formed by printing an electric element forming paste on a surface of said ceramic substrate on which said conductor pattern forming film is bonded in said bonding step and then by sintering said electric element forming paste; and a filling step of charging an electrically conductive paste into an end-closed via-hole before performing said laminating step, said end-closed via-hole extending across said conductor pattern forming film and having a bottom defined by said conductor pattern formed on said conductor pattern forming film, wherein in said bonding step said electrically conductive paste filled in said end-closed via-hole provides an electric connection between said conductor pattern formed on said conductor pattern forming film and said printed conductor pattern formed on said ceramic substrate.

6. The manufacturing method for a printed circuit board in accordance with claim 1, wherein said printed conductor pattern is formed of glass grains and silver, copper or gold grains.

7. The manufacturing method for a printed circuit board in accordance with claim 1, wherein said conductive paste of said via-holes is sintered to turn into an electrically conductive composition and to form a solid-phase diffusion layer in a boundary between said electrically conductive composition and each conductor pattern due to a solid-phase diffusion of a tin component of said electrically conductive composition and a conductive component of said conductor pattern, and said electrically conductive composition is connected with each conductor pattern through said solid-phase diffusion layer.

8. The manufacturing method for a printed circuit board in accordance with claim 1, wherein said conductive paste of said via-holes is sintered to turn into an electrically conductive composition and to form a solid-phase diffusion layer in a boundary between said electrically conductive composition and each conductor pattern due to a solid-phase diffusion of a tin component of said electrically conductive composition and a conductive component of said conductor pattern, said printed conductor pattern is formed by sintering a paste including glass grains and silver, copper or gold grains, said printed conductor pattern is directly connected with said electrically conductive composition, and said electrically conductive composition is connected with each conductor pattern through said solid-phase diffusion layer.

* * * * *